(12) United States Patent
Tan et al.

(10) Patent No.: US 12,080,562 B2
(45) Date of Patent: Sep. 3, 2024

(54) ATOMIC LAYER ETCH AND ION BEAM ETCH PATTERNING

(71) Applicant: Lam Research Corporation, Fremont, CA (US)

(72) Inventors: Samantha Siamhwa Tan, Newark, CA (US); Tamal Mukherjee, Fremont, CA (US); Wenbing Yang, Campbell, CA (US); Girish Dixit, San Jose, CA (US); Yang Pan, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 177 days.

(21) Appl. No.: 17/627,054

(22) PCT Filed: Sep. 9, 2020

(86) PCT No.: PCT/US2020/049871
§ 371 (c)(1),
(2) Date: Jan. 13, 2022

(87) PCT Pub. No.: WO2021/055197
PCT Pub. Date: Mar. 25, 2021

(65) Prior Publication Data
US 2022/0254649 A1  Aug. 11, 2022

Related U.S. Application Data

(60) Provisional application No. 62/901,702, filed on Sep. 17, 2019.

(51) Int. Cl.
*H01L 21/3213* (2006.01)
*H01J 37/305* (2006.01)
(Continued)

(52) U.S. Cl.
CPC .... *H01L 21/32136* (2013.01); *H01J 37/3053* (2013.01); *H01J 37/3244* (2013.01);
(Continued)

(58) Field of Classification Search
None
See application file for complete search history.

(56) References Cited

U.S. PATENT DOCUMENTS 9,406,535 B2   8/2016  Berry, III et al.
9,673,071 B2   6/2017  Wood et al.
(Continued)

FOREIGN PATENT DOCUMENTS

CN  111834288  * 10/2020  ........... H01L 21/768
JP  H 02-116126   4/1990
(Continued)

OTHER PUBLICATIONS

International Search Report from International Application No. PCT/US2020/049871 dated Dec. 21, 2020.
(Continued)

*Primary Examiner* — Jiong-Ping Lu
(74) *Attorney, Agent, or Firm* — Beyer Law Group LLP

(57) ABSTRACT

A method for selectively etching a stack with respect to a mask is provided. An atomic layer etch is provided to at least partially etch the stack, wherein the atomic layer etch forms at least some residue. An ion beam is provided to etch the stack, wherein the ion beam etch removes at least some of the residue from the atomic layer etch.

16 Claims, 7 Drawing Sheets

(51) Int. Cl.
   *H01J 37/32*    (2006.01)
   *H01L 21/02*    (2006.01)
   *H01L 21/306*   (2006.01)
   *H01L 21/3065*  (2006.01)
   *H01L 21/311*   (2006.01)
   *H10N 50/01*    (2023.01)

(52) U.S. Cl.
   CPC .. *H01J 37/32743* (2013.01); *H01J 37/32899* (2013.01); *H01L 21/02057* (2013.01); *H01L 21/30621* (2013.01); *H01L 21/3065* (2013.01); *H01L 21/31116* (2013.01); *H01L 21/31138* (2013.01); *H01L 21/31144* (2013.01); *H01L 21/32135* (2013.01); *H01L 21/32139* (2013.01); *H10N 50/01* (2023.02); *H01J 37/321* (2013.01); *H01J 2237/334* (2013.01)

(56) References Cited

U.S. PATENT DOCUMENTS

| | | | |
|---|---|---|---|
| 9,806,252 B2 * | 10/2017 | Tan | C23F 1/12 |
| 10,256,108 B2 | 4/2019 | Fischer et al. | |
| 10,374,144 B2 | 8/2019 | Tan et al. | |
| 10,672,978 B2 | 6/2020 | Lee et al. | |
| 2011/0192820 A1 | 8/2011 | Yeom et al. | |
| 2011/0203734 A1 | 8/2011 | Koji | |
| 2013/0316536 A1 | 11/2013 | Seto et al. | |
| 2018/0114700 A1 | 4/2018 | Woo et al. | |
| 2018/0142355 A1 | 5/2018 | Yang et al. | |

FOREIGN PATENT DOCUMENTS

| | | |
|---|---|---|
| JP | 2013-243307 | 12/2013 |
| JP | 2016-105462 | 6/2016 |
| JP | 2016-208031 | 12/2016 |
| JP | 2017-157836 | 9/2017 |
| JP | 2017-535057 | 11/2017 |
| KR | 2019-0054475 | 5/2019 |
| TW | 201626482 | 7/2016 |

OTHER PUBLICATIONS

Written Opinion from International Application No. PCT/US2020/049871 dated Dec. 21, 2020.
Japanese Notice of Reasons for Refusal from Japanese Application No. 2022-515725, Jun. 11, 2024 with Machine Translation.
Taiwanese First Office Action from Taiwanese Application No. 109131463, Jun. 25, 2024 with Machine Translation.

* cited by examiner

ATOMIC LAYER ETCH AND ION BEAM ETCH PATTERNING

CROSS-REFERENCE TO RELATED APPLICATION

This application claims the benefit of priority of U.S. Application No. 62/901,702, filed Sep. 17, 2019, which is incorporated herein by reference for all purposes.

BACKGROUND

The background description provided here is for the purpose of generally presenting the context of the present disclosure. Anything described in this background section, and potentially aspects of the written description, are not expressly or impliedly admitted as prior art with respect to the present application.

The disclosure relates to a method of forming semiconductor devices on a semiconductor wafer. More specifically, the disclosure relates to the selective etching of semiconductor devices.

In forming semiconductor devices, magnetic random access memory (MRAM) may be formed using a pattern transfer process. Such a pattern transfer process uses an etch process. The MRAM stack contains non-volatile and ferromagnetic materials such as cobalt (Co), iron (Fe), manganese (Mn), nickel (Ni), platinum (Pt), palladium (Pd), and ruthenium (Ru) which are extremely difficult to pattern without using complicated approaches with ion beam etching (IBE), reactive ion etching (RIE) and wet chemistries. Despite many years of development, current patterning technologies still suffer from many drawbacks such as sidewall re-deposition causing tapered profile and shorting of a magnetic tunnel junction (MTJ) to the fixed layer, and corrosion causing MTJ layer damage. In some conventional techniques, a chlorine-containing chemistry is used to etch metal, but the etched byproducts include non-volatile compounds. The non-volatile compounds may subsequently re-deposit onto sidewalls of the feature. However, as devices shrink and fabrication of various types of structures become more complex, some etched byproducts may re-deposit onto other exposed regions of a substrate, which may cause defects and eventual device failure.

For large critical dimension (CD) structures with wide pitch, a single-step or multi-step IBE recipe may be sufficient. But for small CD or tight pitch features of sub-100 nm, patterning with IBE is difficult. A fundamental limitation is the ion incidence shadowed by a mask, which prevents effective MRAM stack etch and trim.

SUMMARY

To achieve the foregoing and in accordance with the purpose of the present disclosure, a method for selectively etching a stack with respect to a mask is provided. An atomic layer etch is provided to at least partially etch the stack, wherein the atomic layer etch forms at least some residue. An ion beam etch is provided to etch the stack, wherein the ion beam etch removes at least some of the residue from the atomic layer etch.

In another manifestation, an apparatus for selectively etching a stack with respect to a mask is provided. A vacuum transport module is provided. An atomic layer etch chamber is connected to the vacuum transport module. An ion beam etch chamber is connected to the vacuum transport module. An encapsulation chamber is connected to the vacuum transport module. A controller is controllably connected to the vacuum transport module, the atomic layer etch chamber, the ion beam etch chamber, and the encapsulation chamber. The controller is configured to control the vacuum transport module to move the stack from the vacuum transport module into the atomic layer etch chamber, control the atomic layer etch chamber to provide an atomic layer etch of the stack, control the vacuum transport module to move the stack to the ion beam etch chamber, control the ion beam etch chamber to provide an ion beam etch of the stack, control the vacuum transport module to move the stack from the ion beam etch chamber to the encapsulation chamber, and control the encapsulation chamber to provide encapsulation of the stack.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
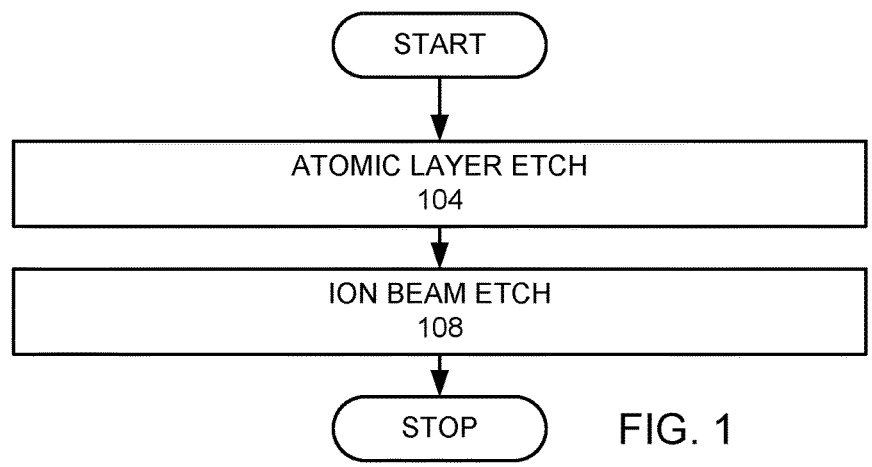
FIG. 1 is a high level flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

During semiconductor wafer processing, features may be etched through a metal containing layer. In the formation of magnetic random access memories (MRAM), a plurality of thin metal layers or films may be sequentially etched to form magnetic tunnel junction stacks.

A magnetic tunnel junction (MTJ) is composed of a thin dielectric barrier layer between two magnetic materials. Electrons pass through the barrier by the process of quantum tunneling. This can serve as a basis for magnetic-based memory, using a spin-transfer torque.

The spin-transfer torque is an effect in which the orientation of a magnetic layer in an MTJ can be modified using a spin-polarized current. Charge carriers (e.g., electrons) have a property known as spin. Spin is a small quantity of angular momentum intrinsic to the carrier. An electrical current is generally unpolarized (50% spin-up and 50% spin-down electrons). By passing a current through a thick magnetic layer (usually called the "fixed layer"), a spin polarized current, with more electrons of either spin can be produced. If this spin-polarized current is directed into a second, thinner magnetic layer (the "free layer"), angular momentum can be transferred to this layer, changing its orientation. This effect can be used to excite oscillations or even flip the orientation of the magnet.

Spin-transfer torque can be used to flip the active elements in magnetic random-access memory. Spin-transfer torque magnetic random-access memory (STT-RAM or STT-MRAM) has the advantages of lower power consumption and better scalability over conventional magnetoresistive random-access memory (MRAM). MRAM uses magnetic fields to flip the active elements.

Spin-Torque Transfer Random Access Memory (STT-RAM) device patterning has been demonstrated via either reactive ion etch followed by ion beam etch (IBE); or by a full inert-gas angular IBE strategy. The Reactive ion etch (RIE) process normally results in a tapered profile and heavy sidewall re-deposition of etch byproducts. Moreover, the chemical damages to MgO layers limit RIE only processes for MRAM patterning.

The IBE technique is developed for MRAM pattern transfer while minimizing MTJ damage caused by reactive species. A common approach is to first implement IBE at normal incidence to shape the MTJ and minimize footing and then remove re-deposition from the initial step by providing a sidewall clean by providing IBE at a grazing incidence. Since IBE relies on the sputter of inert ions, sidewall re-deposition exists during pattern transfer. IBE and oxidation cycles were generally implemented to remove shorting pathways and stop on the MgO tunnel barrier, preserving a pristine and continuous free layer for spin transport.

Methods of plasma dry etching MRAM stacks are described in "Dry Plasma Etch Method To Pattern MRAM Stack," by Tan et al., U.S. Pat. No. 9,806,252, issued Oct. 31, 2017, which is incorporated by reference for all purposes. Methods for providing an ion beam etch are described in, "Ion Beam Etching System," by Singh et al, U.S. Pat. No. 9,257,295, issued Feb. 9, 2016, which is incorporated by reference for all purposes.

For large critical dimension (CD) structures with wide pitch, a single-step or multi-step IBE recipe may be sufficient. But for small CD or tight pitch features of sub-100 nm, patterning with IBE is difficult. A fundamental limitation is the ion incidence shadowed by a mask. This limitation prevents effective MRAM stack etch and trim.

In an embodiment, the primary pattern transfer was realized through atomic layer etch (ALE). The ALE process incorporates Si-species to form volatile etch byproduct for cobalt (Co) and iron (Fe) containing materials. The mechanism of chemical etch enables minimal sidewall re-deposition. ALE is therefore able to pattern tight pitches without the limitation from the aspect ratio. Although halogen plasma was involved, the ALE process minimizes MgO damage compared to RIE, since the Ar step in the ALE cycle removes and purges reactive species. The ALE process opened the MRAM stack and defined the overall profile.

In the embodiment, the second step of an IBE treatment was applied to the MRAM pillar defined by ALE. The IBE step contributed to sidewall residue removal that minimizes the potential damage from surface absorbed halogen species. IBE further trims the MRAM sidewall toward a vertical profile. Since ALE is used to etch the MTJ stacks forming volatile by-product, the IBE step is not being used in the incidence angle mode to pattern MRAM, but rather the cleaning with grazing angle to remove the residue and/or footing of the stack.

The integrated process of ALE with IBE has advantages in two aspects. 1) IBE step effectively removed the halogen species on the MRAM stack surface and sidewall. For ALE patterning, the residue halogen species such as from the chamber wall imposes a concern of leaving behind a chlorinated surface layer. The sidewall residues deteriorate electrical properties causing shorting devices or degraded electric signals. Moreover, inert ions further removed the halogenated surface layer with minimum halogen residues remaining. 2) The integration flow circumvents the limitation of IBE for patterning toward high aspect ratio or tight pitch structures. Since the chemical etch from ALE primarily defines the MRAM pillar, the limitation to patterning is not limited by the ion incidence angle from IBE anymore. The integration used in an embodiment provides the solution to pattern high density MRAM arrays without re-deposition or corrosion across MTJ sidewalls.

Figure 2A:
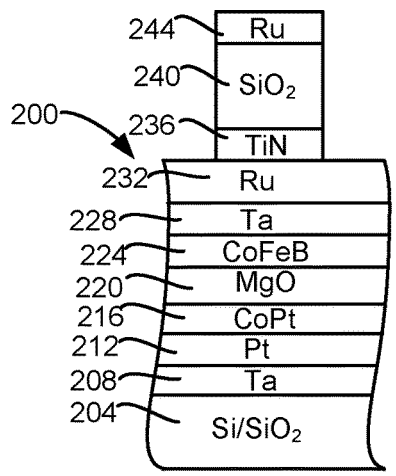
FIGS. 2A-C are schematic cross-sectional views of a stack processed according to an embodiment.

To facilitate understanding, FIG. 1 is a high level flow chart of an embodiment. In this embodiment, a stack is subjected to an atomic layer etch (step 104). The stack may include multiple layers of different materials. For example, the stack may include one or more layers of magnetic materials used in a typical MRAM. FIG. 2A is a schematic cross-sectional view of an example stack 200 that can be processed using the process shown in FIG. 1. The stack 200 is on a substrate with a silicon or silicon oxide ($Si/SiO_2$) layer 204. A first tantalum (Ta) layer 208 is over the $Si/SiO_2$ layer 204. A platinum (Pt) layer 212 is over the first Ta layer 208. A cobalt platinum alloy (CoPt) layer 216 is over the Pt layer 212. A magnesium oxide (MgO) layer 220 is over the CoPt layer 216. A cobalt iron boron (CoFeB) layer 224 is over the MgO layer 220. A second Ta layer 228 is over the CoFeB layer 224. A ruthenium (Ru) layer 232 is over the second Ta layer 228. A patterned mask is formed over the stack 200. In this embodiment, the patterned mask comprises a titanium nitride layer 236, under a $SiO_2$ layer 240, under a Ru layer 244. In this embodiment, an optional Ru layer 244 opening etch is provided before the atomic layer etch (step 104). The Ru layer 244 opening etch is provided using an oxygen containing plasma.

Figure 3:
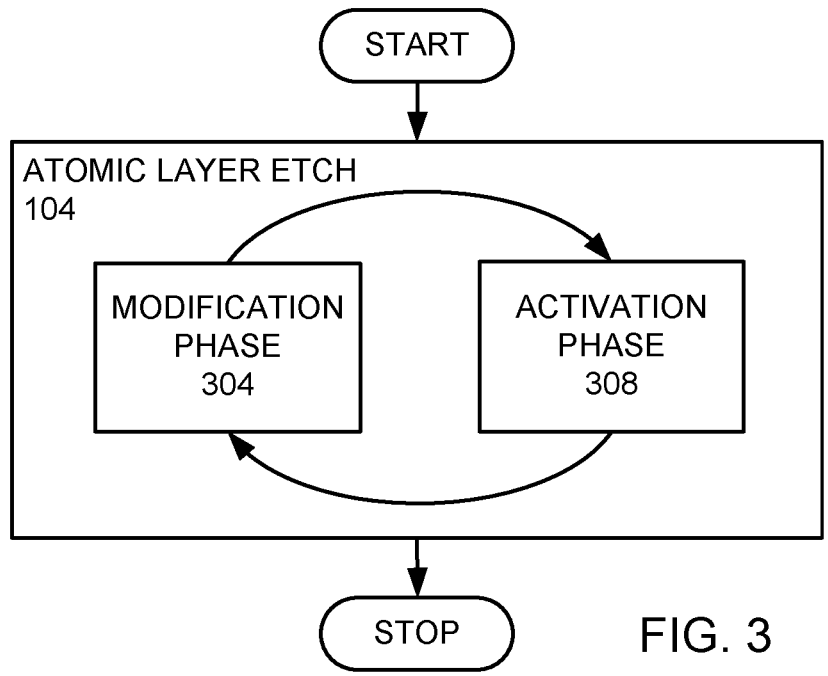
FIG. 3 is a more detailed flow chart of an atomic layer etch process.
Figure 4:
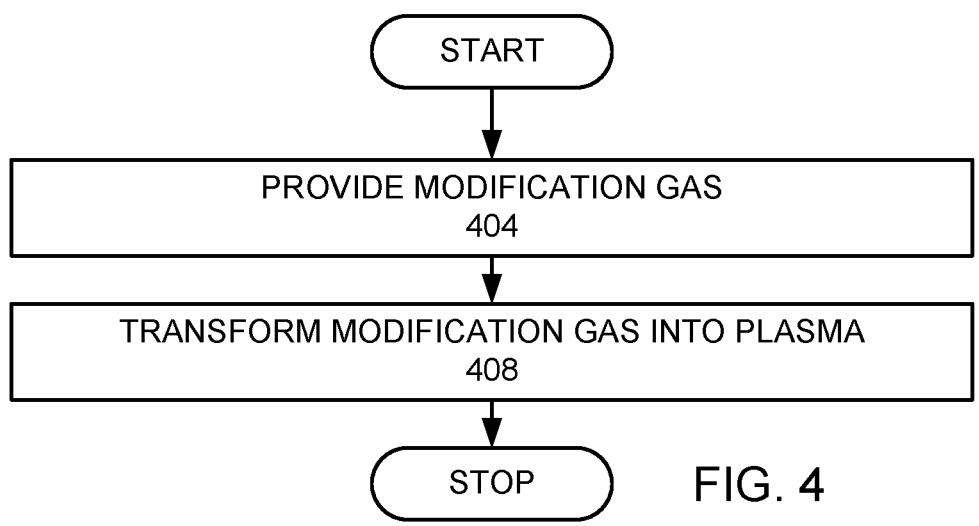
FIG. 4 is a more detailed flow chart of a modification phase.

FIG. 3 is a more detailed flow chart of the atomic layer etch (step 104). The atomic layer etch comprises a plurality of cycles, wherein each cycle comprises a modification phase (step 304) and an activation phase (step 308). FIG. 4 is a more detailed flow chart of the modification phase. A modification gas is provided (step 404). The modification gas may be any appropriate gas that can modify a surface to facilitate the activation phase. For instance, the modification gas may be a halogen containing gas. In one embodiment, the modification gas comprises between 5 to 200 sccm of silicon tetrachloride ($SiCl_4$). The modification gas is transformed into a plasma (step 408). As some example conditions, the plasma may be generated using a plasma power between about 100 (watts) W and 900 W. The temperature during this operation may be between about 60° C. and about 200° C. The chamber pressure during this operation may be between about 1 millitorr (mTorr) and about 500 mTorr. Without being bound by a particular theory, it is believed that the plasma dissociates the SiCl$_4$ molecules to generate chlorine and Si—Cl species. In some instances, a pulsed bias may be applied. The Si—Cl species forms a modification layer of Si—Cl components adsorbed into the metal layer. For the different metals M in the different layers, the chlorine and Si—Cl component species are adsorbed into different metals M to form an atomic layer of MSiCl$_x$, where x is an integer between 1 and 3 inclusive. The atomic layer may be a monolayer or may be thicker than a monolayer or may be an incomplete monolayer.

Figure 5A:
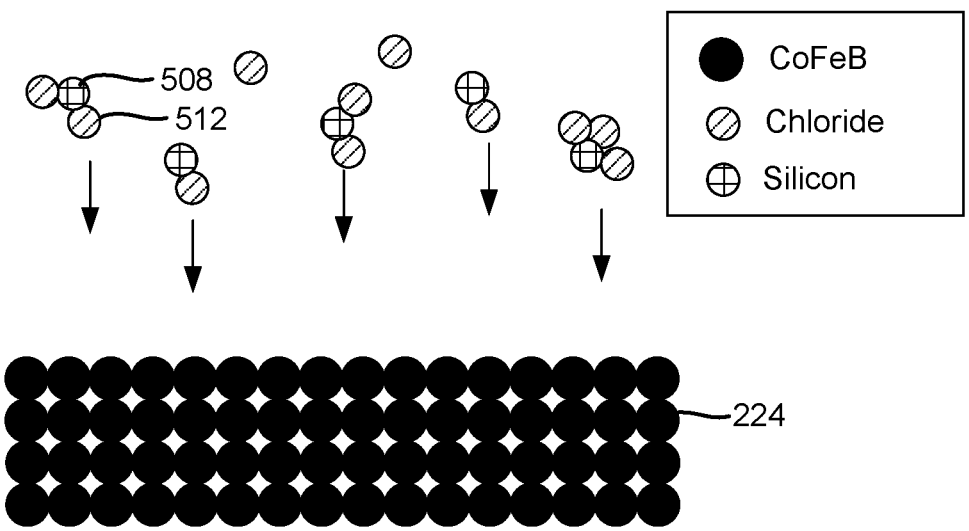
FIGS. 5A-C are more detailed cross-sectional views of a metal layer processed according to the embodiment.
Figure 5B:
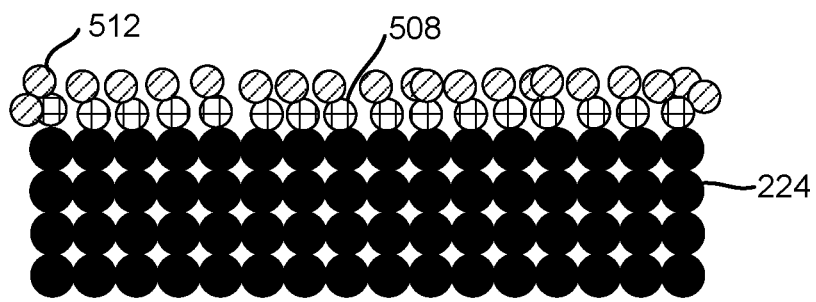
Figure 5C:
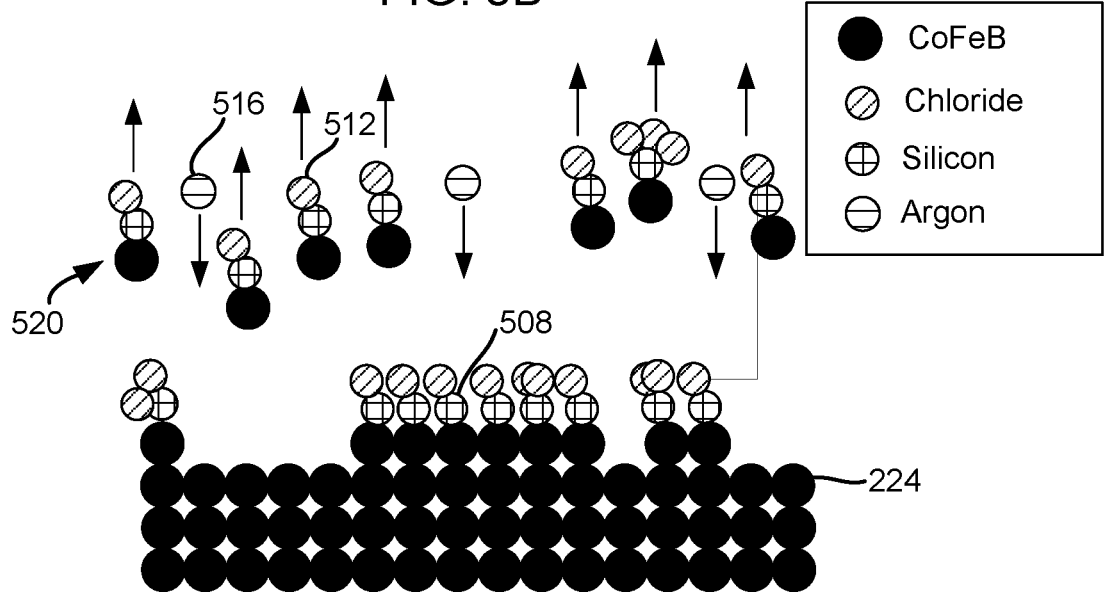

FIGS. 5A-C illustrate molecular interactions as a stack is being processed. In particular, FIGS. 5A-C show the stack of FIG. 2A being processed. FIG. 5A is an enlarged schematic view of part of the CoFeB layer 224. The modification gas of SiCl$_4$ has been formed into a plasma of species containing Si 508 and Cl 512. The species in the plasma are SiCl$_x$, where x is an integer from 1 to 3 inclusive. In addition, there may be individual chlorine ions. A bias accelerates the SiCl$_x$ species to the CoFeB layer 224. The SiCl$_x$ species bond to the top exposed surface of the CoFeB layer 224 forming a monolayer.

In this embodiment, after the monolayer is formed the modification phase (step 304) is stopped. FIG. 5B is an enlarged schematic view of part of the CoFeB layer 224 after a monolayer of SiCl$_x$ is formed over the top surface of the CoFeB layer 224, creating a modified surface of part of the CoFeB layer 224. The bias and/or the flow of the modification gas and/or the plasma power may be stopped.

After the atomic layer is formed and the modification phase (step 304) is completed, the stack 200 is subjected to an activation phase (step 308). The activation phase may include providing a gas that may be activated, such as a gas with which a plasma may be generated. For example, an activation gas may be a noble gas. In this embodiment, the stack 200 is subjected to an argon (Ar) plasma to provide the activation phase (step 308). In this embodiment, an activation gas comprising Ar is provided. The activation gas is activated. The activation of the activated gas may be by forming the activation gas into a plasma. The plasma may be generated using a plasma power between about 100 W and 900 W. The temperature during this operation may be between about 60° C. and about 300° C. The chamber pressure during this operation may be between about 1 mTorr and about 500 mTorr. The Ar plasma volatilizes the MSiCl$_x$ molecules, allowing the removal of the MSiCl$_x$ molecules. As a result, the modified surface of the metal layers is selectively etched way with respect to the mask. Therefore, the surface modification is used to etch the stack 200. In other embodiments, the thermal activation may be used to activate the activation gas.

FIG. 5C is an enlarged schematic view of part of the CoFeB layer 224 during the activation phase. Argon ions 516 are accelerated by the bias towards the CoFeB layer 224. The Ar ions 516 activate a complex of MSiCl$_x$, where M stands for the metal which in this case is CoFeB, creating a volatilized complex of MSiCl$_x$ 520. The bias provides enough energy to the Ar ions 516 to volatilize the complex of MSiCl$_x$ 520, but not enough energy to etch redeposited residue. The steps of providing a modification phase (step 304) and an activation phase (step 308) are cyclically repeated a plurality of time providing the atomic layer etch (step 104) of the stack 200.

Figure 2B:
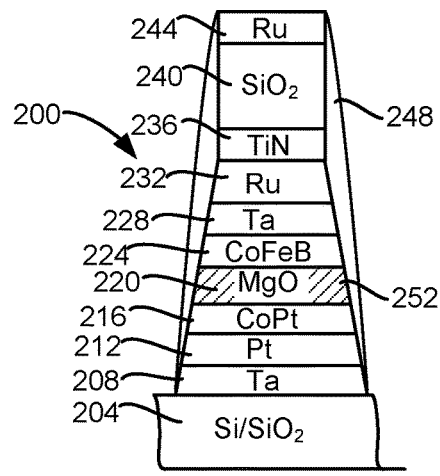

FIG. 2B is a schematic cross-sectional view of the stack 200 after the ALE has been provided (step 104). A residue layer 248 of redeposited residue material is formed on sidewalls of the stack 200. The residue layer 248 comprises metal material, silicon, and chlorine residue. Some of the chlorine may migrate to and attack certain layers, such as the MgO layer 220 to form regions of MgO impregnated with chlorine 252. The deposition of the residue layer 248 on the sidewalls of the stack 200 causes the etching of the stack 200 to be tapered, as indicated by the non-vertical sides.

After the ALE (step 104) of the stack 200 is complete, the stack 200 is subjected to IBE (step 108). Ion beam etching refers to the removal of atoms by physical sputtering using an inert gas. Physical sputtering is provided by momentum exchange between ions of the inert gas and the material being etched by collision with the ions. In an embodiment, the chamber pressure is maintained below 20 mTorr. A low pressure reduces collisions of ions with gas and reduces the likelihood of forming a plasma. In this embodiment, the ions are Ar ions. In other embodiments, other ions may be used that are different than ions provided by the activation gas. The ions are accelerated to have an energy in the range of 50 volts (V) to 1800 V. The ions have sufficient energy to sputter the residue layer 248 and the M atoms or molecules.

Figure 2C:
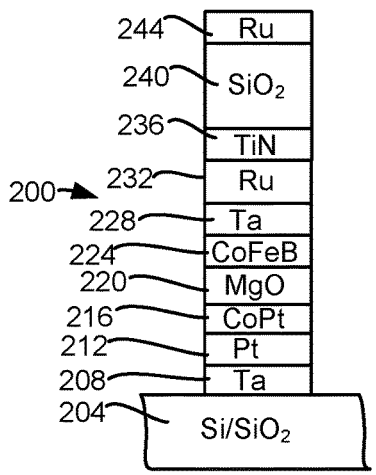

FIG. 2C is a schematic cross-sectional view of the stack 200 after the IBE (step 108) has been provided. The IBE (step 108) removes the residue layer 248 and the chlorine 252 impregnating the MgO layer 220. In addition, the IBE (step 108) removes or reduces the taper. In this example, the sidewalls of the stack 200 are vertical as a result of the removal of the taper by the IBE (step 108).

The ALE (step 104) is able to etch higher aspect ratio features than an IBE process alone. In addition, the features provided by the above embodiment are able to have a higher pitch than features formed with an IBE process alone. An ALE process alone could result in a more tapered stack with sidewall deposition. If the IBE process (step 108) is not provided, the chlorine 252 impregnating and attacking the MgO layer 220 would etch away some of the MgO layer 220. The IBE process (step 108) is able to reduce or remove the taper and the residue layer 248. The IBE process (step 108) is able to remove the chlorine 252 impregnating the MgO layer 220 without etching away some of the MgO layer 220.

In this embodiment, the ALE (step 104) is able to etch all of the layers in the stack 200 with one recipe. Since the stack 200 is relatively thin, for example, less than 30 nm thick, the ALE (step 104) is performed for less than 15 minutes. The IBE process (step 108) is also able to remove or reduce a footer at the bottom of the stack 200. In other embodiments, the ALE (step 104) at least partially etches the stack 200.

In various embodiments, the stack 200 may be a stack for MRAM. In various embodiments, the stack 200 may be a magnetic tunnel junction (MTJ) composed of a thin dielectric barrier layer between two magnetic materials. In various embodiments, the stack 200 comprises at least one metal containing layer. The metal containing layer may comprise at least one of Cr, Mo, Ir, Ti, Ru, Mn, Ni, Pd, Ta, Co, Fe, Mg, and Pt. In an example, the stack comprises at least one layer of MgO. Other stacks may have other transition metals in the 1st, 2nd, and 3rd rows (e.g., Group IV transition metals, Group V transition metals, and Group VI transition metals), including metals such as Cu.

In the above embodiment, the modification gas comprises SiCl$_4$. In other embodiments, the modification gas comprises a halosilane. Examples of halosilanes are iodosilanes, bromosilanes, chlorosilanes, hydrochlorosilanes, and fluorosilanes. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, dit-butylchlorosilane, chloroisopropylsilane, chloro-sec-butylsilane, t-butyldimethylchlorosilane, thexyldimethylchlorosilane, SiHCl—(N(CH$_3$)$_2$)$_2$, and the like. In some embodiments, the silicon in the modification gas may be replaced with germanium, carbon, titanium, or tin. In various embodiments, the modification gas comprises a halogen-containing gas comprising an element selected from the group consisting of silicon, germanium, carbon, titanium, and tin. In other embodiments, the metal silicon and chlorine molecule (MSiCl$_x$) may more generally be described as a metal tetrel halogen molecule. In the specification and claims, the metal tetrel halogen molecule is defined as a molecule with at least one metal atom, at least one halogen atom, and a tetrel of at least one of silicon, germanium, silicon, titanium, and tin. When the metal tetrel halogen molecule comprises silicon, then the metal tetrel halogen molecule is a volatile metal silo complex. In another embodiment, SiCl$_4$ and CO precursor may be used to produce M(SiCl$_3$)(CO). In another embodiment, precursors of Cl$_2$ and H$_2$O may be used to form MCl$_x$(H$_2$O)$_y$. In another embodiment, a precursor of methanol (CH$_3$OH) may be used.

In other embodiments, the reaction gas may be another noble gas instead of Ar. In other embodiments, the reaction gas may be one or more of carbon monoxide (CO), water (H$_2$O), CH$_3$OH, or ammonia (NH$_3$). The reaction gas is transformed into reaction gas ions.

In some embodiments, the ALE (step 104) may be used to provide an overetch. The overetch etches some of the silicon or silicon oxide (Si/SiO$_2$) layer 204. The overetch reduces the taper of the stack 200 etched by the ALE (step 104). During the etching of the silicon or silicon oxide (Si/SiO$_2$) layer 204 of the overetch, less material is redeposited, so that the residue layer 248 is etched away and the taper may be reduced. The overetch may also be used to reduce or remove the stack footer.

One or more additional processes may be performed on the stack before or after or during the above steps in the above embodiment. For example, an additional IBE opening step may be used to partially open the stack 200 before the ALE (step 104). Such a process may open a CoFeB layer, allowing the opening of the CoFeB layer without exposing the CoFeB to halogen. In another embodiment, the ALE (step 104) and the IBE (step 108) may be provided cyclically for at least two cycles. Such processes may have a slower throughput.

Further, the order and sequence of the example processes described above may be revised in any useful manner. For instance, other embodiments may provide an IBE to etch layers before the ALE and then use an IBE after the ALE to remove residue. Still, other embodiments may etch one or more layers using IBE and then etch one or more layers using ALE and then etch one or more layers using IBE and then etch one or more layers using ALE.

Figure 6:
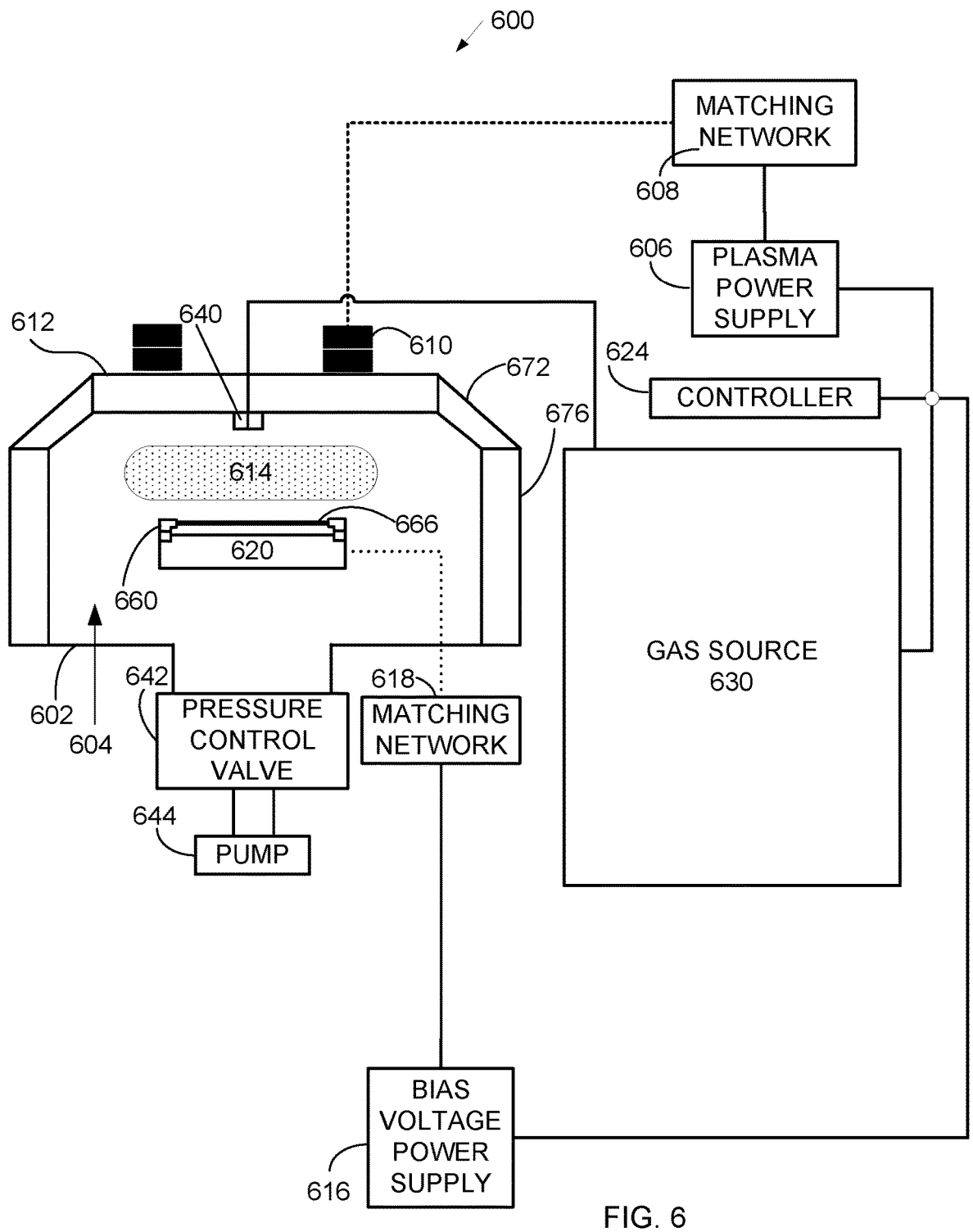
FIG. 6 is a schematic illustration of an atomic layer etch chamber system.

To provide an embodiment of a processing chamber that may be used for the ALE process (step 104), FIG. 6 schematically illustrates an example of an ALE chamber system 600 that may be used for the ALE process. The ALE chamber system 600 includes a plasma reactor 602 having a plasma processing confinement chamber 604 therein. A plasma power supply 606, tuned by a plasma matching network 608, supplies power to a transformer coupled plasma (TCP) coil 610 located near a dielectric inductive power window 612 to create a plasma 614 in the plasma processing confinement chamber 604 by providing an inductively coupled power. A pinnacle 672 extends from a chamber wall 676 of the plasma processing confinement chamber 604 to the dielectric inductive power window 612 forming a pinnacle ring. The pinnacle 672 is angled with respect to the chamber wall 676 and the dielectric inductive power window 612, such that the interior angle between the pinnacle 672 and the chamber wall 676 and the interior angle between the pinnacle 672 and the dielectric inductive power window 612 are each greater than 90° and less than 180°. The pinnacle 672 provides an angled ring near the top of the plasma processing confinement chamber 604, as shown. The TCP coil (upper power source) 610 may be configured to produce a uniform diffusion profile within the plasma processing confinement chamber 604. For example, the TCP coil 610 may be configured to generate a toroidal power distribution in the plasma 614. The dielectric inductive power window 612 is provided to separate the TCP coil 610 from the plasma processing confinement chamber 604 while allowing energy to pass from the TCP coil 610 to the plasma processing confinement chamber 604. The TCP coil 610 act as an electrode for providing radio frequency (RF) power to the plasma processing confinement chamber 604. A wafer bias voltage power supply 616 tuned by a bias matching network 618 provides power to an electrode 620 to set the bias voltage on the substrate 666. The substrate 666 is supported by the electrode 620 so that the electrode acts as a substrate support. A controller 624 controls the plasma power supply 606 and the wafer bias voltage power supply 616.

The plasma power supply 606 and the wafer bias voltage power supply 616 may be configured to operate at specific radio frequencies such as, for example, 13.56 megahertz (MHz), 27 MHz, 2 MHz, 60 MHz, 400 kilohertz (kHz), 2.54 gigahertz (GHz), or combinations thereof. Plasma power supply 606 and wafer bias voltage power supply 616 may be appropriately sized to supply a range of powers in order to achieve desired process performance. For example, in one embodiment, the plasma power supply 606 may supply the power in a range of 50 to 5000 Watts, and the wafer bias voltage power supply 616 may supply a bias voltage of in a range of 20 to 2000 V. In addition, the TCP coil 610 and/or the electrode 620 may be comprised of two or more sub-coils or sub-electrodes. The sub-coils or sub-electrodes may be powered by a single power supply or powered by multiple power supplies.

As shown in FIG. 6, the ALE chamber system 600 further includes a gas source/gas supply mechanism 630. The gas source 630 is in fluid connection with plasma processing confinement chamber 604 through a gas inlet, such as a gas injector 640. The gas injector 640 may be located in any advantageous location in the plasma processing confinement chamber 604 and may take any form for injecting gas. Preferably, however, the gas inlet may be configured to produce a "tunable" gas injection profile. The tunable gas injection profile allows independent adjustment of the respective flow of the gases to multiple zones in the plasma process confinement chamber 604. More preferably, the gas injector is mounted to the dielectric inductive power window 612. The gas injector may be mounted on, mounted in, or form part of the power window. The process gases and by-products are removed from the plasma process confinement chamber 604 via a pressure control valve 642 and a pump 644. The pressure control valve 642 and pump 644 also serve to maintain a particular pressure within the plasma processing confinement chamber 604. The pressure control valve 642 can maintain a pressure of less than 1 torr during processing. An edge ring 660 is placed around the substrate 666. The gas source/gas supply mechanism 630 is controlled by the controller 624. A Kiyo by Lam Research Corp. of Fremont, CA, may be used to practice an embodiment.

Figure 7:
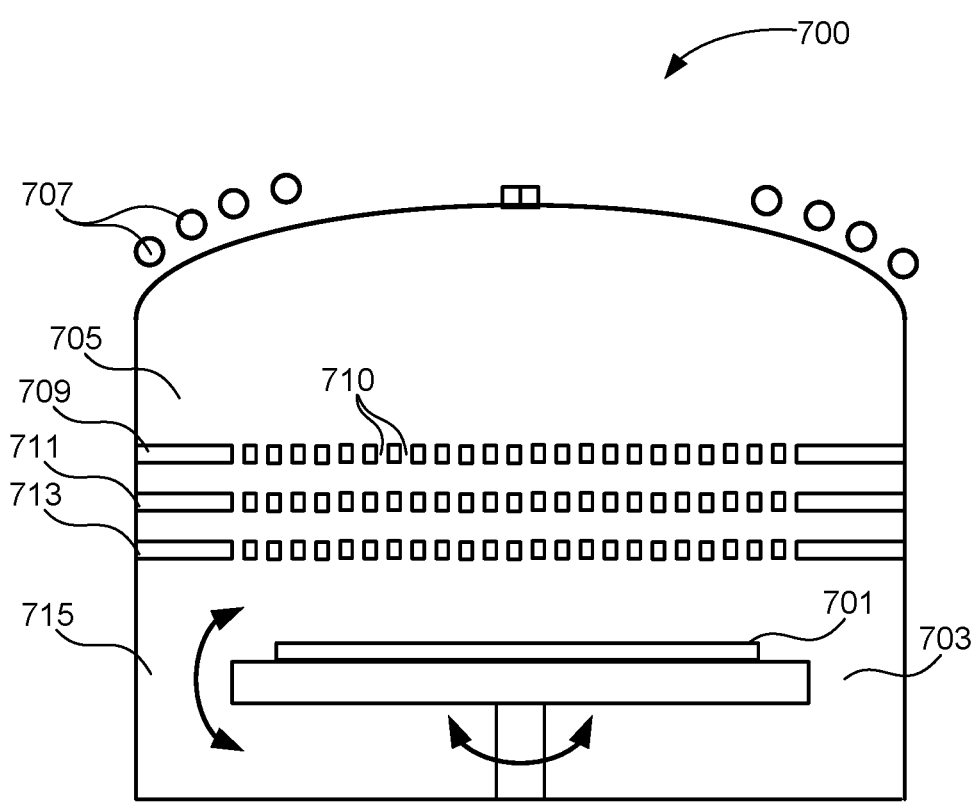
FIG. 7 is a schematic illustration of an ion beam etch chamber.

To show an embodiment of an ion beam etch chamber, FIG. 7 presents a simplified cross-sectional view of an ion beam etch chamber 700 for performing ion beam etching according to certain methods. In this example, substrate 701 rests on the substrate support 703. The ion beam etch chamber 700 may be equipped with hardware (not shown) to provide electrical and fluidic connections. The electrical connections may be used to supply electricity to the substrate support 703 or to an electrostatic chuck located on or within the substrate support 703 in some cases, while the fluidic connections may be used to provide fluids used to control the temperature of the substrate 701 and substrate support 703. The substrate support 703 may be heated by a heater (not shown) and/or cooled by a cooling mechanism (not shown). Any appropriate cooling mechanism may be used. In one example, the cooling mechanism may involve flowing cooling fluids through piping in or adjacent to the substrate support 703. The substrate support 703 may be capable of rotating and tilting at variable speeds and angles, as indicated by the double-headed arrows in FIG. 7. The rotating and tilting causes the ion beam to be incident at continuously varying angles. The varying angles of the IBE cause more of the residue layer 248 to be exposed to the IBE causing the residue layer 248 to be removed more quickly.

A plasma generation gas is delivered to a primary plasma generation region 705. The plasma generation gas is energized by a plasma source 707. In the context of FIG. 7, the plasma source 707 is a coil that acts as an inductively coupled plasma source. Other sources such as capacitively coupled sources, microwave sources, or discharge sources may be employed in appropriately designed reactors. Plasma forms in the primary plasma generation region 705. An extraction electrode 709 includes a series of apertures 710 through which ions are extracted.

The apertures 710 may have a diameter between about 0.5-1 cm, and a height that is defined by the thickness of the electrode. The apertures 710 may have a height to width aspect ratio (AR) between about 0.01-100.0. In some cases, the apertures 710 are arranged in a hexagonal, square grid, or spiral pattern, though other patterns may be used as well. A center-to-center distance between neighboring apertures may be between about 1 mm-10 cm. The apertures may be configured to achieve an overall open area (i.e., the sum of the area of each aperture) that is between about 0.1%-95% of the surface area of the electrode when considering only a single (top or bottom) face of the electrode. For example, an electrode having a diameter of 40 cm and 500 holes each having a diameter of 1 cm will have an open area of about 31% (393 cm$^2$ open area divided by 1257 cm$^2$ total area). The apertures 710 may have different diameters in different electrodes. In some cases, the aperture diameter is smaller in upper electrodes and larger in lower electrodes. In one embodiment, the apertures in a lower electrode 713 are larger than the apertures in a focus electrode 711 (e.g., between about 0-30% larger). In these or other cases, the apertures in the focus electrode 711 are larger than the apertures in the extraction electrode 709 (e.g., between about 0-30% larger).

A bias $V_1$ applied to the extraction electrode 709 with respect to the substrate 701 acts to provide kinetic energy to the ion with respect to the substrate. This bias is generally positive and can range between about 20-10,000 volts or more. In certain cases, the bias on the extraction electrode is between about 20-2,000 volts. Positive ions in the plasma above extraction electrode 709 are attracted to the lower electrode 713 by the potential difference between electrodes 709 and 713. A focus electrode 711 is added to focus the ions, and if needed, repel electrons. A bias $V_2$ on this electrode can be either positive or negative with respect to the extraction electrode 709 but is generally biased negatively. The bias potential of focus electrode 711 is determined by the lensing characteristics of the focus electrode 711. Bias voltages on the focus electrode 711 include positive voltages between about 1.1× to 20× the potential $V_1$ on the extraction electrode, and negative voltages having a magnitude between about 0.001× to 0.95× the potential of $V_1$. Due to the different potentials applied to the different electrodes, a potential gradient exists. The potential gradient may be on the order of about 1000 V/cm. Example separation distances between neighboring electrodes fall between about 0.1-10 cm, or for example about 1 cm.

After the ions leave the bottom of the grounded lower electrode 713, they travel in a collimated and focused beam if the focus electrode 711 voltage is set to produce a collimated beam. Alternatively, the beam can be made divergent if the focus electrode voltage is adjusted to either under- or over-focus the ion beam. The lower electrode 713 is grounded in many (but not all) cases. The use of a grounded lower electrode 713 in combination with a grounded substrate 701 results in a substrate processing region 715 that is substantially field free. Having the substrate located in a field-free region prevents electrons or secondary ions generated by collisions between the ion beam with residual gases or with surfaces in the reaction chamber from being accelerated towards the substrate, thereby minimizing the risk of causing unwanted damage or secondary reactions.

Additionally, it is important to prevent the substrate 701 from charging from the ion beam itself, or from ejected secondary electrons generated during the ion beam collision with the substrate. Neutralization is typically accomplished by adding a low energy electron source (not shown) in the vicinity of the substrate 701. Since the positive charge on the ion and the ejected secondary electrons both charge the substrate positively, low energy electrons in the vicinity of the substrate can be attracted to the positively charged surface and can neutralize this charge. Performing this neutralization is much easier in a field free region.

In some applications, it may be desirable to have a potential difference between the lower electrode 713 and substrate 701. For example, if very low energy ions are required, it is difficult to maintain a well-collimated beam at low energy over long distances due to mutual repulsion of the positively charged ions (space-charge effects). One solution to this is to place a negative bias on the lower electrode 713 with respect to substrate 701 (or conversely biasing substrate 701 positively with respect to the lower electrode 713). This allows extracting the ions at higher energy, then slowing them down as they approach the substrate.

Each of the electrodes 709, 711, and 713 has a thickness. The thickness may be between about 0.5 mm-10 cm, or between about 1 mm-3 cm, for example about 5 mm. The electrodes 709, 711, and 713 may each be the same thickness, or they may have different thicknesses. Further, the separation distance between the extraction electrode 709 and the focus electrode 711 may be the same, greater, or less than the separation distance between the focus electrode 711 and the lower electrode 713.

The apertures 710 in the extraction electrode 709, focus electrode 711 and lower electrode 713 may be precisely aligned with one another. Otherwise, ions will be aimed incorrectly, and the on-wafer etching results will be poor. For instance, if a single aperture in the focus electrode 711 is misaligned, it may result in one area of the substrate 701 becoming over-etched (where too many ions are directed) and another area of the substrate 701 becoming under-etched (where no ions or too few ions are directed). As such, the apertures should be as aligned with one another as much as possible. In various cases, the misalignment between vertically adjacent electrodes is limited to about 1% or less of the hole diameter (as measured by the distance of a linear shift in the position of the aperture as compared to the adjacent aperture).

Ion beam etching processes are typically run at low pressures. In some embodiments, the pressure may be about 100 mTorr or less, for example about 1 mTorr or less, and in many cases about 0.1 mTorr or less. The low pressure helps minimize undesirable collisions between ions and any gaseous species present in the substrate processing region. In certain cases, a relatively high pressure reactant is delivered in an otherwise low pressure ion processing environment.

Figure 8:
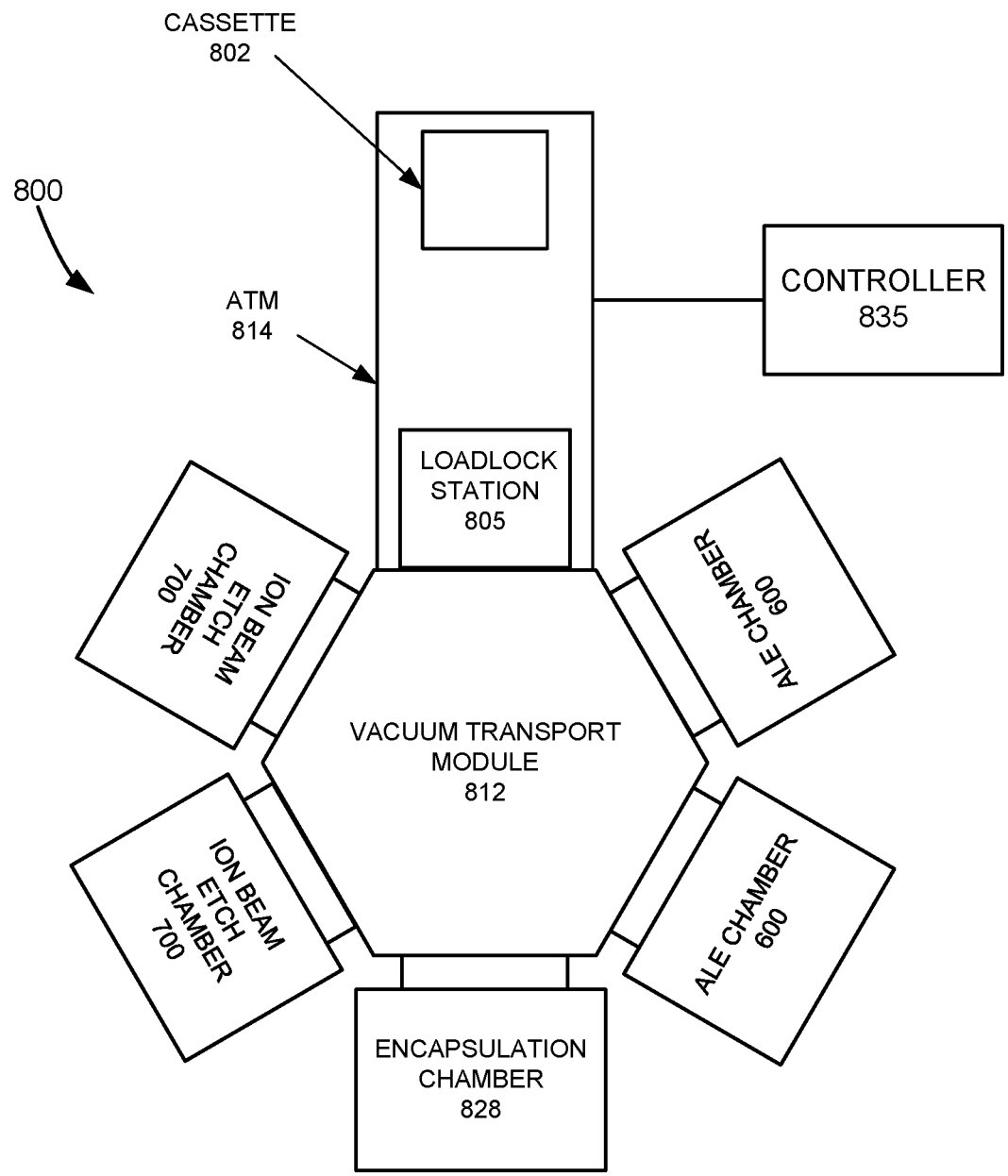
FIG. 8 is a top schematic view of a processing tool that may be used in an embodiment.

In an embodiment, a processing tool may provide a platform that provides a chamber for the ALE process, a chamber for the IBE process, and a chamber to encapsulate the resulting devices. FIG. 8 is a top schematic view of a processing tool 800 used in an embodiment. A cassette 802 houses unprocessed wafers before they are processed and then holds the treated wafers once all processing is complete in the processing tool 800. The cassette 802 can hold many wafers, often as many as 25. An atmosphere transport module (ATM) 814 is used to transport wafers to and from the cassette 802. A load lock station 805 represents at least one device that operates to transfer the wafer back and forth between the atmosphere of the ATM 814 and the vacuum of a vacuum transport module (VTM) 812. The VTM 812 is part of the processing tool and connects to a plurality of chambers. There may be different types of chambers. In this embodiment, there are two ALE chambers 600 and two ion beam etch chambers 700 and an encapsulation chamber 828. In this embodiment, the ALE chambers 600 are Kiyo® chambers manufactured by Lam Research, Fremont, CA The ion beam etch chambers 700 is a Kyber® chamber manufactured by Lam Research, Fremont CA The encapsulation chamber 828 may be a plasma enhanced chemical vaporization deposition (PECVD) chamber or another dielectric deposition chamber, such as a VECTOR® PECVD chamber manufactured by Lam Research, Fremont CA A robotic system within the vacuum transport module 812 uses a robotic arm to move a wafer with a stack between the load lock station 805 and the different chambers 600, 700, 828. The ATM 814 uses a robotic system to transfer wafers between the cassette 802 and the load lock station 805 in a vacuum environment. A controller 835 may be used to control the processing tool 800. The controller 835 may comprise one or more sub-controllers. The controller 835 that may comprise one or more sub-controllers is controllably connected to the vacuum transport module 812, the atomic layer etch chambers 600, the ion beam etch chambers 700, and the encapsulation chamber 828.

Figure 9:
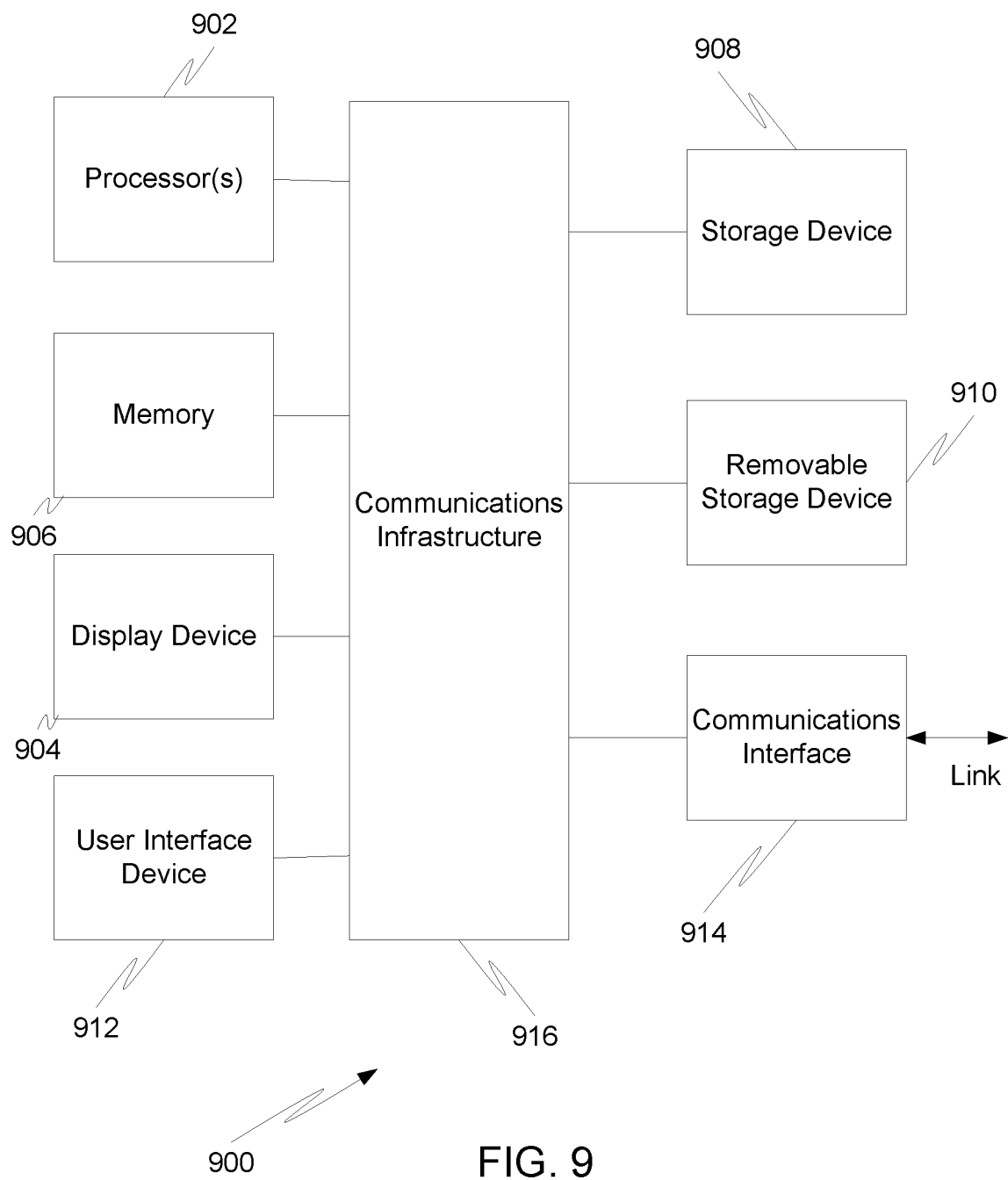
FIG. 9 is a schematic view of a computer system that may be used in practicing an embodiment.

FIG. 9 is a high level block diagram showing a computer system 900. The computer system 900 is suitable for implementing a controller 835 used in embodiments. The computer system 900 may have many physical forms ranging from an integrated circuit, a printed circuit board, and a small handheld device up to a huge supercomputer. The computer system 900 includes one or more processors 902, and further can include an electronic display device 904 (for displaying graphics, text, and other data), a main memory 906 (e.g., random access memory (RAM)), storage device 908 (e.g., hard disk drive), removable storage device 910 (e.g., optical disk drive), user interface devices 912 (e.g., keyboards, touch screens, keypads, mice or other pointing devices, etc.), and a communications interface 914 (e.g., wireless network interface). The communications interface 914 allows software and data to be transferred between the computer system 900 and external devices via a link. The system may also include a communications infrastructure 916 (e.g., a communications bus, cross-over bar, or network) to which the aforementioned devices/modules are connected.

Information transferred via communications interface 914 may be in the form of signals such as electronic, electromagnetic, optical, or other signals capable of being received by communications interface 914, via a communications link that carries signals and may be implemented using wire or cable, fiber optics, a phone line, a cellular phone link, a radio frequency link, and/or other communications channels. With such a communications interface 914, it is contemplated that the one or more processors 902 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer readable code include machine code, such as produced by a compiler, and files containing higher level code that are executed by a computer using an interpreter. Computer readable media may also be computer code transmitted by a computer data signal a processor.

In some embodiments, the computer readable media may comprise computer readable code for transferring a stack to the ALE chamber 600, computer readable code for performing an ALE process (step 104), computer readable code for transferring the stack to the ion beam etch chamber 700, computer readable code for performing an ion beam etch (step 108), computer readable code for transferring the stack 200 to the encapsulation chamber 828, computer readable code for encapsulating the stack 200, and computer readable code for removing the stack 200 from the processing tool 800 into the atmosphere. Encapsulating the stack after the stack 200 is etched and before the stack 200 is exposed to the atmosphere prevents oxidation of various layers of the stack. Oxidation of various layers of the stack 200 may cause device failure. An integrated processing tool 800 with an ALE chamber 600, an ion beam etch chamber 700, and an encapsulation chamber 828 provides a faster throughput of etched MRAM.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for selectively etching a stack with respect to a mask, comprising:
   providing an atomic layer etch to at least partially etch the stack, wherein the atomic layer etch forms at least some redeposited residue; and
   providing an ion beam etch of the stack, wherein the ion beam etch removes at least some of the redeposited residue from the atomic layer etch.

2. The method, as recited in claim 1, wherein the providing the atomic layer etch, comprises a plurality of cycles, wherein each cycle comprises:
   a modification phase, comprising:
      providing a modification gas comprising a halogen-containing gas comprising an element selected from the group consisting of silicon, germanium, carbon, titanium, and tin; and
      transforming the modification gas into a plasma, wherein components from the plasma modify part of a surface of the stack to form a modified surface; and
   an activation phase, wherein the activation phase etches the modified surface of the stack.

3. The method of claim 2, wherein the halogen-containing gas is selected from the group consisting of iodosilanes, bromosilanes, chlorosilanes, hydrochlorosilanes, and fluorosilanes.

4. The method, as recited in claim 2, wherein the activation phase, comprises:
   providing an activation gas; and
   activating the activation gas.

5. The method, as recited in claim 4, wherein the activation phase further comprises applying a bias.

6. The method of claim 2, wherein the activation phase generates a metal tetrel halogen molecule.

7. The method of claim 6, wherein the metal tetrel halogen molecule comprises metal, silicon, and halogen.

8. The method, as recited in claim 1, wherein the stack comprises at least one metal containing layer.

9. The method, as recited in claim 1, wherein the stack comprises at least one transition metal containing layer.

10. The method, as recited in claim 1, wherein the providing the atomic layer etch, comprises a plurality of cycles, wherein each cycle comprises:
    a modification phase, comprising:
       providing a modification gas comprising a halogen-containing gas; and
       transforming the modification gas into a plasma, wherein components from the plasma modify part of a surface of the stack to form a modified surface; and
    an activation phase, wherein the activation phase etches the modified surface of the stack.

11. The method, as recited in claim 1, further comprising providing an ion beam opening etch before providing the atomic layer etch.

12. The method, as recited in claim 1, wherein the redeposited residue comprises halogen.

13. A method for selectively etching a stack with respect to a mask, comprising:
    providing an atomic layer etch to at least partially etch the stack, wherein the atomic layer etch forms at least some residue; and
    providing an ion beam etch of the stack, wherein the ion beam etch removes at least some of the residue from the atomic layer etch, wherein the providing the ion beam etch comprises directing gas ions towards the stack at continuously varying angles.

14. The method, as recited in claim 13, wherein the ion beam etch reduces taper of the stack.

15. The method, as recited in claim 13, wherein the ion beam etch removes halogen impregnating a metal containing layer of the stack.

16. The method, as recited in claim 13, wherein the ion beam etch removes chlorine impregnating a metal containing layer of the stack without etching the metal containing layer of the stack.

* * * * *